United States Patent
Chang et al.

(10) Patent No.: US 8,765,613 B2
(45) Date of Patent: Jul. 1, 2014

(54) HIGH SELECTIVITY NITRIDE ETCH PROCESS

(75) Inventors: Josephine B. Chang, Mahopac, NY (US); Sebastian U. Engelmann, New York, NY (US); Nicholas C. M. Fuller, North Hills, NY (US); Michael A. Guillorn, Yorktown Heights, NY (US); Masahiro Nakamura, Eastchester, NY (US)

(73) Assignees: International Business Machines Corporation, Armonk, NY (US); Zeon Corporation, Tokyo (JP)

( * ) Notice: Subject to any disclaimer, the term of this patent is extended or adjusted under 35 U.S.C. 154(b) by 156 days.

(21) Appl. No.: 13/281,688

(22) Filed: Oct. 26, 2011

(65) Prior Publication Data
US 2013/0105916 A1    May 2, 2013

(51) Int. Cl.
*H01L 21/302* (2006.01)
(52) U.S. Cl.
USPC ................. 438/738; 438/701; 438/595
(58) Field of Classification Search
USPC .......................................... 438/738, 701, 595
See application file for complete search history.

(56) References Cited

U.S. PATENT DOCUMENTS

| | | | |
|---|---|---|---|
| 5,562,801 A | 10/1996 | Nulty | |
| 5,644,153 A | 7/1997 | Keller | |
| 6,010,968 A | 1/2000 | Yang et al. | |
| 6,139,647 A | 10/2000 | Armacost et al. | |
| 6,383,918 B1 | 5/2002 | Ku et al. | |
| 6,465,359 B2 | 10/2002 | Yamada et al. | |
| 6,838,388 B2 | 1/2005 | Tadokoro et al. | |
| 6,916,746 B1 | 7/2005 | Hudson et al. | |
| 7,338,907 B2 | 3/2008 | Li et al. | |
| 2003/0211750 A1 | 11/2003 | Kim et al. | |
| 2007/0032074 A1 | 2/2007 | Kwak et al. | |
| 2009/0176375 A1 | 7/2009 | Benson et al. | |
| 2011/0008959 A1 | 1/2011 | Morgan | |
| 2011/0068086 A1 | 3/2011 | Suzuki et al. | |

OTHER PUBLICATIONS

International Search Report and Written Opinion dated Dec. 28, 2012, issued in International Application No. PCT/US12/61775.

*Primary Examiner* — Douglas Menz
(74) *Attorney, Agent, or Firm* — Scully, Scott, Murphy & Presser, P.C.; Louis J. Percello, Esq.

(57) ABSTRACT

An anisotropic silicon nitride etch provides selectivity to silicon and silicon oxide by forming a fluorohydrocarbon-containing polymer on silicon surfaces and silicon oxide surfaces. Selective fluorohydrocarbon deposition is employed to provide selectivity to non-nitride surfaces. The fluorohydrocarbon-containing polymer interacts with silicon nitride to form a volatile compound, thereby enabling etching of silicon nitride. The fluorohydrocarbon-containing polymer interacts with silicon oxide at a low reaction rate, retarding, or completely stopping, the etching of silicon oxide. The fluorohydrocarbon-containing polymer does not interact with silicon, and protects silicon from the plasma. The anisotropic silicon nitride etch can be employed to etch silicon nitride selective to silicon and silicon oxide in any dimension, including small dimensions less than 50 nm.

5 Claims, 12 Drawing Sheets

HIGH SELECTIVITY NITRIDE ETCH PROCESS

BACKGROUND

The present disclosure relates to semiconductor processing methods, and particularly to methods for anisotropically etching silicon nitride with high selectivity to silicon and silicon oxide, and structures for effecting the same.

Etching silicon nitride selective to more than one material is very challenging. Poor performance in selective etching of silicon nitride is often observed especially at the nanoscale level.

An example of poor performance in selectivity of a nitride etch process is observed in the spacer module in which silicon nitride spacers are formed to electrically isolate gate electrodes from source and drain regions. Lack of sufficient selectivity causes formation of recesses within semiconductor material portions that are not covered by the gate electrodes.

Another example of poor performance in selectivity of a nitride etch is observed in a trench silicide etch in which a silicon nitride layer is employed as an etch stop layer. Lack of sufficient selectivity during the etch of the silicon nitride layer causes a dielectric layer to be excessively etched or recess formed in the silicide itself.

A typical silicon nitride etch process employs single carbon $CH_xF_y$ gases which are admixed with Ar, $H_2$, $N_2$ and/or $O_2$ gases. A fluorohydrocarbon plasma employed in such a silicon nitride etch process is selective to silicon oxide, i.e., does not etch silicon oxide. Selectivity to silicon is facilitated by admixture of the $O_2$ gas, which converts silicon into silicon oxide and thus, prevents further erosion of silicon upon formation of a silicon oxide layer. Variations of the silicon etch process are employed in such modules such as a trench silicide module.

One of the drawbacks of the silicon nitride etch employing $CH_3F$ and $O_2$ gases is that the selectivity to silicon is not inherent in the etch process, and that the selectivity to silicon relies on conversion of silicon to silicon oxide. At the nanoscale level, however, the conversion of silicon into silicon oxide requires significant consumption of silicon on a relative scale. As a result, the silicon nitride etch process known in the art does not provide high selectivity to silicon at the nanoscale level.

BRIEF SUMMARY

An anisotropic silicon nitride etch provides selectivity to silicon and silicon oxide by forming a fluorohydrocarbon-containing polymer on silicon surfaces and silicon oxide surfaces. Selective fluorohydrocarbon deposition is employed to provide selectivity to non-nitride surfaces. The fluorohydrocarbon-containing polymer interacts with silicon nitride to form a volatile compound, thereby enabling etching of silicon nitride. The fluorohydrocarbon-containing polymer interacts with silicon oxide at a low reaction rate, retarding, or completely stopping, the etching of silicon oxide. The fluorohydrocarbon-containing polymer does not interact with silicon, and protects silicon from the plasma. The anisotropic silicon nitride etch can be employed to etch silicon nitride selective to silicon and silicon oxide in any dimension, including small dimensions less than 50 nm.

According to an aspect of the present disclosure, a method of forming a semiconductor structure is provided. The method includes: forming a silicon portion, a silicon oxide portion, and a silicon nitride portion on a semiconductor substrate; and anisotropically etching the silicon nitride portion employing a fluorohydrocarbon-containing plasma; and anisotropically etching the silicon nitride portion employing a fluorohydrocarbon-containing plasma, wherein a first fluorohydrocarbon-containing polymer having a first thickness is formed on the silicon portion, a second fluorohydrocarbon-containing polymer having a second thickness is formed on the silicon oxide portion, and a third fluorohydrocarbon-containing polymer having a third thickness is formed on the silicon nitride portion. The first thickness can be greater than the second thickness, and can be greater than the third thickness.

According to another aspect of the present disclosure, another method of forming a semiconductor structure is provided. The method includes: forming a shallow trench isolation structure including silicon oxide within a semiconductor material portion in a semiconductor substrate; forming a gate stack including a gate dielectric, a gate electrode, and a gate cap dielectric on the semiconductor material portion; forming a silicon nitride layer on the gate stack, the semiconductor material portion, and the shallow trench isolation structure; and anisotropically etching the silicon nitride layer to form a silicon nitride spacer laterally surrounding the gate stack. A top surface of the shallow trench isolation structure and a top surface of the semiconductor material portion are physically exposed and subsequently recessed during the anisotropic etching. A first recess distance by which a top surface of the silicon nitride spacer is recessed after physical exposure of a surface of the semiconductor material portion can be greater than a second recess distance by which a top surface of the shallow trench isolation structure is recessed after the physical exposure of the surface of the semiconductor material portion, and can be greater than a third recess distance by which a top surface of the semiconductor material portion is recessed after the physical exposure of the surface of the semiconductor material portion.

According to yet another aspect of the present disclosure, yet another method of forming a semiconductor structure is provided. The method includes: forming a gate stack and at least one gate spacer over a semiconductor material portion in a semiconductor substrate; forming a silicon nitride liner over the gate stack, the gate spacer, and the semiconductor material portion; forming a patterned masking structure over the silicon nitride liner; and anisotropically etching the silicon nitride liner employing a plasma to form at least one opening therein. A first fluorohydrocarbon-containing polymer having a first thickness is formed directly on the semiconductor material portion at a bottom of the at least one opening. A second fluorohydrocarbon-containing polymer having a second thickness is formed directly on a silicon oxide surface of the at least one gate spacer. The first thickness can be greater than the second thickness.

According to even another aspect of the present disclosure, a semiconductor structure is provided, which includes: a gate stack located over a semiconductor material portion in a semiconductor substrate; at least one gate spacer laterally surrounding the gate stack and having a silicon oxide surface on an outer sidewall thereof; a silicon nitride liner located over the gate spacer and including an opening therein, wherein the silicon oxide surface and a surface of the semiconductor material portion underlie the opening; a first fluorohydrocarbon-containing polymer having a first thickness and located directly on the surface of the semiconductor material portion and at a bottom of the opening; and a second fluorohydrocarbon-containing polymer having a second thickness and located directly on the silicon oxide surface, wherein the first thickness can be greater than the second thickness.

According to still another aspect of the present disclosure, a semiconductor structure is provided, which includes a semiconductor material portion located in a semiconductor substrate; a shallow trench isolation structure including silicon oxide, embedded within the semiconductor substrate, and in contact with the semiconductor material portion; a gate stack including a gate dielectric, a gate electrode, and a gate cap dielectric and located on the semiconductor material portion; and a silicon nitride spacer laterally surrounding the gate stack. A top surface of the silicon nitride spacer is vertically recessed from a top surface of the gate cap dielectric by a first recess distance. A top surface of the shallow trench isolation structure is vertically recessed from a horizontal plane including an interface between the gate dielectric and the semiconductor material portion by a second recess distance. A top surface of the silicon nitride spacer is located not higher than a top surface of the gate cap dielectric. The first recess distance is less than the second recess distance.

DETAILED DESCRIPTION

Figure 1:
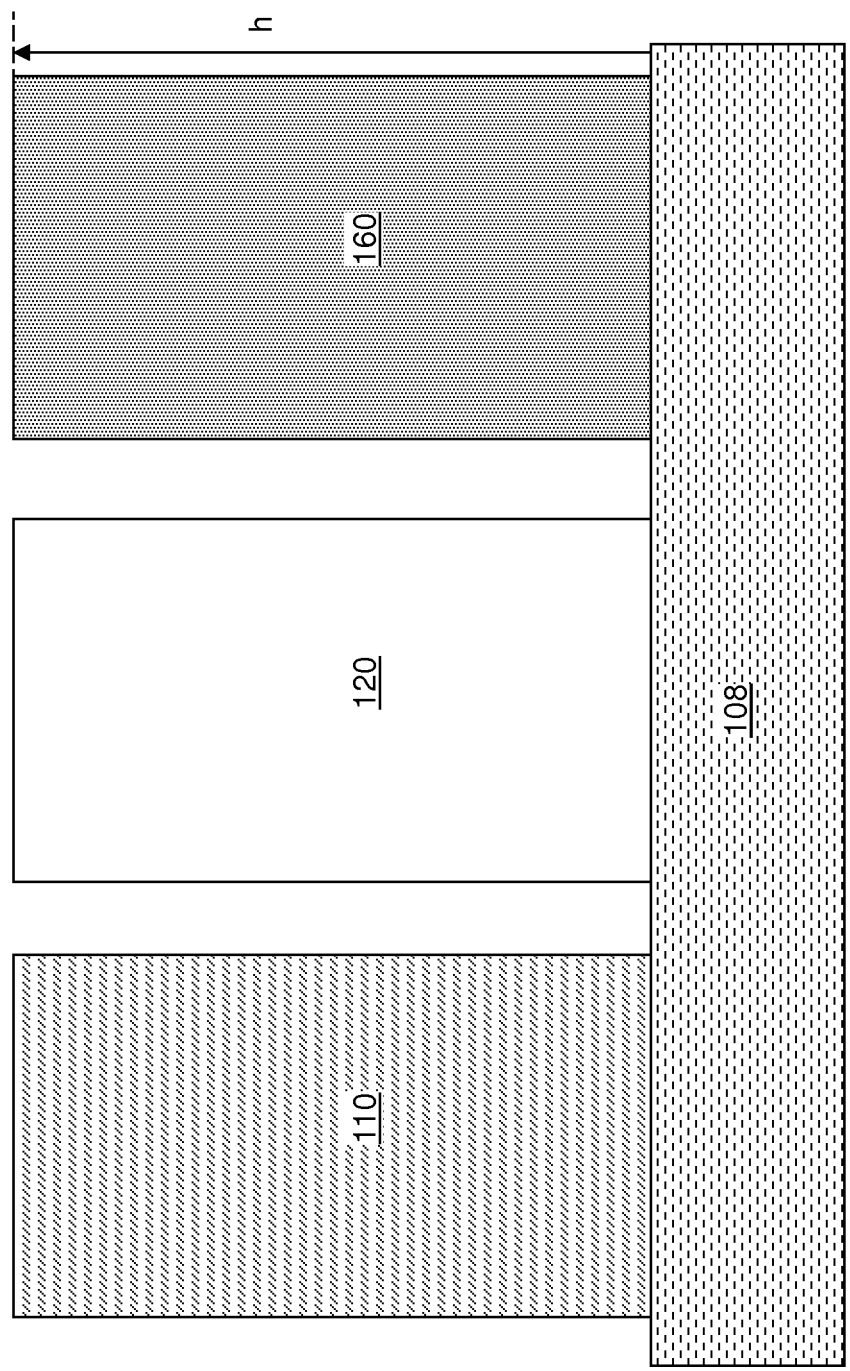
FIG. 1 is a schematic vertical cross-sectional view of a first exemplary structure before an anisotropic etch employing a fluorohydrocarbon-containing plasma according to a first embodiment of the present disclosure.

As stated above, the present disclosure relates to methods for anisotropically etching silicon nitride with high selectivity to silicon and silicon oxide, and structures for effecting the same, which are now described in detail with accompanying figures. Throughout the drawings, the same reference numerals or letters are used to designate like or equivalent elements. The drawings are not necessarily drawn to scale.

Referring to FIG. 1, a first exemplary structure according to a first embodiment of the present disclosure includes a substrate 108, a silicon portion 110 located on a portion of a top surface of the substrate 108, a silicon oxide portion 120 located on another portion of the top surface of the substrate 108, and a silicon nitride portion located on yet another portion of the top surface of the substrate 108. The substrate 108 can include a semiconductor material such as single crystalline silicon, polysilicon, amorphous silicon, a silicon germanium alloy, a silicon carbon alloy, a silicon germanium carbon alloy, a III-V compound semiconductor material, a II-VI compound semiconductor material, or a combination thereof. Alternately or additionally, the substrate 108 can include an insulator material such as silicon oxide, doped derivatives of silicon oxide, silicon nitride, silicon oxynitride, a dielectric metal oxide having a dielectric constant greater than 3.9, or a combination thereof. Alternately or additionally, the substrate 108 can include a metallic material such as Cu, W, Ti, Ta, Al, WN, TiN, TaN, WC, TiC, TiC, or alloys thereof. The top surface of the substrate 108 can include any of the materials that can be employed for the substrate 108.

The silicon portion 110 includes single crystalline silicon, polysilicon, amorphous silicon, or an alloy of silicon with at least another semiconductor material in which silicon is a dominant material (i.e., more than 50% in atomic concentration). The silicon portion 110 can be doped with electrical dopants such as B, Ga, In, P, As, and Sb. The silicon portion 110 can be derived from a portion of the substrate 108 that includes silicon or a silicon alloy. Alternately, the silicon portion 110 can be formed by deposition of silicon or a silicon alloy, for example, by chemical vapor deposition (CVD). The height h of the silicon portion 110 can be from 3 nm to 3,000 nm, although lesser and greater heights can also be employed.

The silicon oxide portion 120 includes undoped silicon oxide or doped silicon oxide. If the silicon oxide portion 120 is doped, the silicon oxide portion 120 can include dopants such as B, P, F, and/or As. The silicon oxide portion 120 can be derived from silicon by thermal or plasma conversion of silicon into oxide, i.e., by thermal oxidation or by plasma oxidation of silicon. Alternately, the silicon oxide portion 120 can be formed by deposition of doped or undoped silicon oxide, for example, by chemical vapor deposition (CVD). While the first exemplary structure illustrates a configuration in which the silicon oxide portion 120 has the same height h as the silicon portion 110, the height of the silicon oxide portion 120 can, in generally, be the same as, or different from, the height of the silicon portion 110. The silicon oxide portion 120 can laterally contact the silicon portion 110, or can be laterally spaced from the silicon portion 110.

The silicon nitride portion 160 includes silicon nitride. The silicon nitride can be stoichiometric having an atomic ratio of 3:4 between silicon and nitrogen, or can be non-stoichiometric. The silicon nitride portion 160 can be derived from silicon by thermal or plasma conversion of silicon into nitride, i.e., by thermal nitridation or by plasma nitridation of silicon. Alternately, the silicon nitride portion 160 can be formed by deposition of silicon nitride, for example, by chemical vapor deposition (CVD). While the first exemplary structure illustrates a configuration in which the silicon nitride portion 160 has the same height h as the silicon portion 110, the height of the silicon nitride portion 160 can, in generally, be the same as, or different from, the height of the silicon portion 110. The silicon nitride portion 160 can laterally contact the silicon portion 110 and/or the silicon oxide portion 120, or can be laterally spaced from the silicon portion 110 and/or the silicon oxide portion 120.

Figure 2:
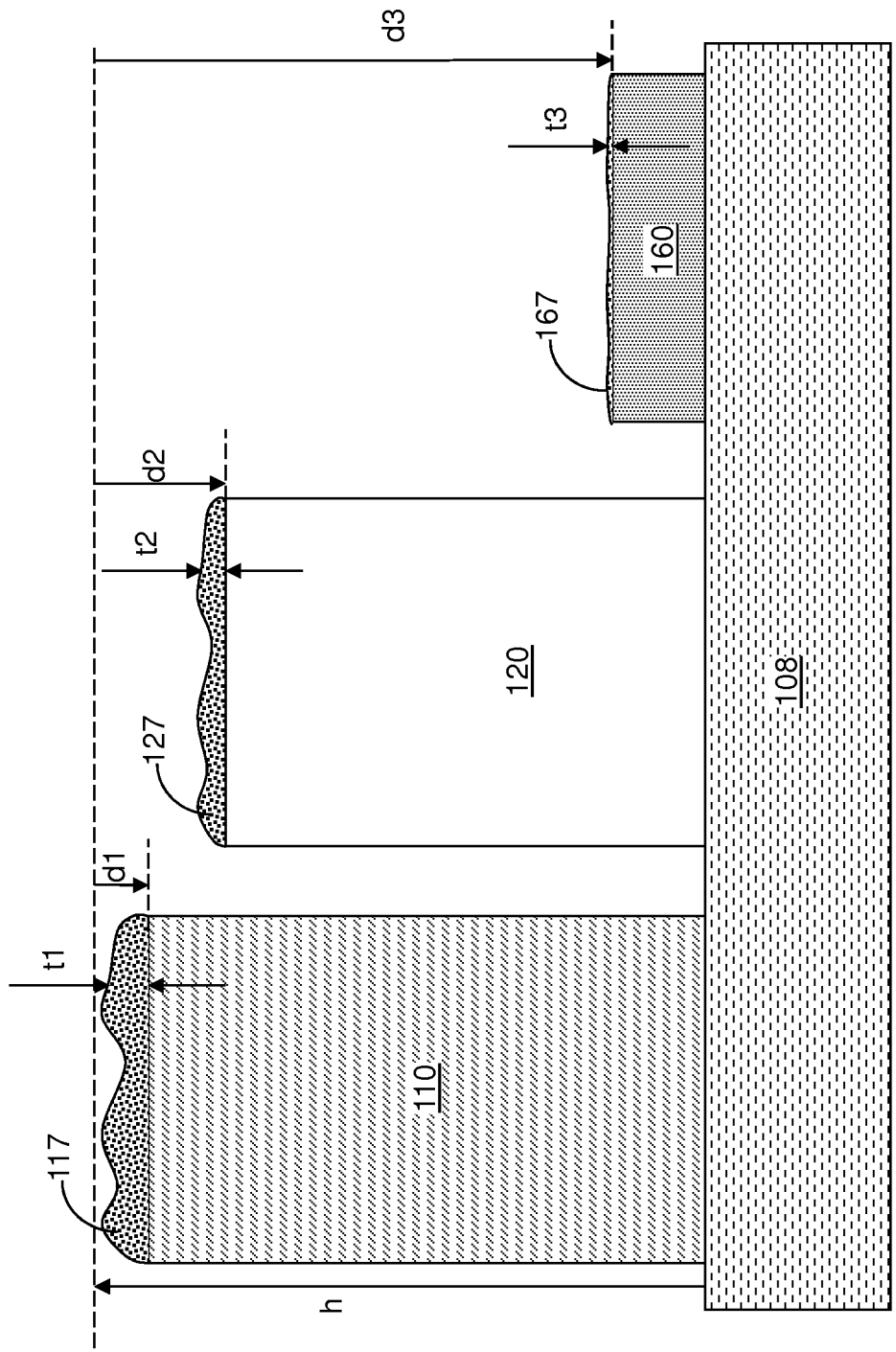
FIG. 2 is a schematic vertical cross-sectional view of the first exemplary structure after an anisotropic etch employing a fluorohydrocarbon-containing plasma according to the first embodiment of the present disclosure.

Referring to FIG. 2, the first exemplary structure is placed into a process chamber configured for a plasma etch, i.e., a reactive ion etch. An anisotropic etch employing a fluorohydrocarbon-containing plasma is performed on the first exemplary structure. The composition of the gas supplied into the process chamber includes one or more fluorohydrocarbon gas (hereafter referred to as "the fluorohydrocarbon gas") having a composition of $C_xH_yF_z$, wherein x is an integer selected from 3, 4, 5, and 6, y and z are positive integers, and y is greater than z. For example, the fluorohydrocarbon gas employed in the present disclosure can include one or more of $C_3H_5F_3$, $C_3H_6F_2$, $C_3H_7F$, $C_3H_4F_2$, $C_3H_5F$, $C_3H_3F$, $C_4H_6F_4$, $C_4H_7F_3$, $C_4H_8F_2$, $C_4H_9F$, $C_4H_5F_3$, $C_4H_6F_2$, $C_4H_7F$, $C_4H_4F_2$, $C_4H_5F$, $C_5H_7F_5$, $C_5H_8F_4$, $C_5H_9F_3$, $C_5H_{10}F_2$, $C_5H_{11}F$, $C_5H_6F_4$, $C_5H_7F_3$, $C_5H_8F_2$, $C_5H_9F$, $C_5H_5F_3$, $C_5H_6F_2$, $C_5H_7F$, $C_6H_8F_6$, $C_6H_9F_5$, $C_6H_{10}F_4$, $C_6H_{11}F_3$, $C_6H_{12}F_2$, $C_6H_{13}F$, $C_6H_7F_5$, $C_6H_8F_4$, $C_6H_9F_3$, $C_6H_{10}F_2$, $C_6H_{11}F$, $C_6H_6F_4$, $C_6H_7F_3$, $C_6H_8F_2$, and $C_6H_9F$. Correspondingly, the fluorohydrocarbon-containing plasma includes ions of $C_xH_yF_z$. Optionally, the composition of the gas supplied into the process chamber can further include $O_2$, CO, $CO_2$, $N_2$, Ar, $H_2$, He or combinations thereof. In other words, the fluorohydrocarbon-containing plasma optionally includes a plasma of $O_2$, CO, $CO_2$, $N_2$, Ar, $H_2$, He or combinations thereof in addition to the plasma of $C_xH_yF_z$.

Non-limiting specific examples of $C_xH_yF_z$, wherein x is an integer selected from 3, 4, 5, and 6, y and z are positive integers, and y is greater than z, include alkanes, alkenes, and alkynes.

In one embodiment, the fluorohydrocarbon gas can include one or more alkane fluorohydrocarbon gas having the formula of $C_xH_yF_z$, wherein x is an integer selected from 3, 4, and 5, y and z are positive integers, and y is greater than z. The one or more alkane fluorohydrocarbon gas can include, but are not limited to: saturated liner fluorohydrocarbons shown by $C_3H_7F$ such as 1-fluoropropane, 2-fluoropropane; saturated liner fluorohydrocarbons shown by $C_3H_6F_2$ such as 1,1-difluoropropane, 2,2-difluoropropane, 1,2-difluoropropane, 1,3-difluoropropane; saturated liner fluorohydrocarbons shown by $C_3H_5F_3$ such as 1,1,1-trifluoropropane, 1,1,2-trifluoropropane, 1,1,3-trifluoropropane, 1,2,2-trifluoropropane; saturated cyclic fluorohydrocarbon shown by $C_3H_5F$ such as fluorocyclopropane; saturated cyclic fluorohydrocarbon shown by $C_3H_4F_2$ such as 1,2-difluorocyclopropane; saturated liner fluorohydrocarbons shown by $C_4H_9F$ such as 1-fluorobutane, 2-fluorobutane; saturated liner fluorohydrocarbons shown by $C_4H_8F_2$ such as 1-fluoro-2-methylpropane, 1,1-difluorobutane, 2,2-difluorobutane, 1,2-difluorobutane, 1,3-difluorobutane, 1,4-difluorobutane, 2,3-difluorobutane, 1,1-difluoro-2-methylpropane, 1,2-difluoro-2-methylpropane, 1,3-difluoro-2-methylpropane; saturated liner fluorohydrocarbons shown by $C_4H_7F_3$ such as 1,1,1-trifluorobutane, 1,1,1-trifluoro-2-methylpropane, 1,1,2-trifluorobutane, 1,1,3-trifluorobutane, 1,1,4-trifluorobutane, 2,2,3-trifluorobutane, 2,2,4-trifluorobutane, 1,1,2-trifluoro-2-methylpropane; saturated liner fluorohydrocarbons shown by $C_4H_6F_4$ such as 1,1,1,2-tetrafluorobutane, 1,1,1,3-tetrafluorobutane, 1,1,1,4-tetrafluorobutane, 1,1,2,2-tetrafluorobutane, 1,1,2,3-tetrafluorobutane, 1,1,2,4-tetrafluorobutane, 1,1,3,3-tetrafluorobutane, 1,1,3,4-tetrafluorobutane, 1,1,4,4-tetrafluorobutane, 2,2,3,3-tetrafluorobutane, 2,2,3,4-tetrafluorobutane, 1,2,3,4-tetrafluorobutane, 1,1,1,2-tetrafluoro-2-methylpropane, 1,1,1,3-tetrafluoro-2-methylpropane, 1,1,2,3-tetrafluoro-2-methylpropane, 1,1,3,3-tetrafluoro-2-methylpropane; saturated cyclic fluorohydrocarbon shown by $C_4H_7F$ such as fluorocyclobutane; saturated cyclic fluorohydrocarbons shown by C4H6F2 such as 1,1-difluorocyclobutane, 1,2-difluorocyclobutane, 1,3-difluorocyclobutane; saturated cyclic fluorohydrocarbon shown by $C_4H_5F_3$ such as 1,1,2-trifluorocyclobutane, 1,1,3-triflurocyclobutane; saturated liner fluorohydrocarbons shown by $C_5H_{11}F$ such as 1-fluoropentane, 2-fluoropentane, 3-fluoropentane, 1-fluoro-2-methylbutane, 1-fluoro-3-methylbutane, 2-fluoro-3-methylbutane, 1-fluoro-2,2-dimethylpropane; saturated liner fluorohydrocarbons shown by $C_5H_{10}F_2$ such as 1,1-difluoropenatne, 2,2-difluoropentane, 3,3-difluoropentane, 1,2-difluoropentane, 1,3-difluoropentane, 1,4-difluoropentane, 1,5-difluoropentane, 1,1-difluoro-2-methylbutane, 1,1-difluoro-3-methylbutane, 1,2-difluoro-2-methylbutane, 1,2-difluoro-3-methylbutane, 1,3-difluoro-2-methylbutane, 1,3-difluoro-3-methylbutane, 1,4-difluoro-2-methylbutane, 2,2-difluoro-3-methylbutane, 2,3-difluoro-2-methylbutane, 1,1-difluoro-2,2-dimethylpropane, 1,3-difluoro-2,2-dimethylproapne, 1-fluoro-2-fluoromethylbutane; saturated liner fluorohydrocarbons shown by $C_5H_9F_3$ such as 1,1,1-trifluoropentane, 1,1,2-trifluoropentane, 1,1,3-trifluoropentane, 1,1,4-trifluoropentane, 1,1,1-trifluoro-2-methylbutane, 1,1,2-trifluoro2,3-dimethylpropane; saturated cyclic fluorohydrocarbons shown by $C_5H_9F$ such as fluorocyclopentane, 1-fluoro-2-methylcyclobutane, 1-fluoro-3-methylcyclobutane, (fluoromethyl)cyclobutane; saturated cyclic fluorohydrocarbons shown by $C_5H_8F_2$ such as 1,2-difluorocyclopentane, 1,3-difluorocyclopentane, 1,1-difluoro-2-methylcyclobutane, 1,1-difluoro-3-methylcyclobutane; saturated cyclic fluorohydrocarbons shown by $C_5H_7F_3$ such as 1,1,2-trifluorocyclopentane, 1,2,3,-trifluorocyclopentane.

Additionally or alternatively, the fluorohydrocarbon gas can include one or more alkene fluorohydrocarbon gas having the formula of $C_xH_yF_z$, wherein x is an integer selected from 3, 4, and 5, y and z are positive integers, and y is greater than z. The one or more alkene fluorohydrocarbon gas can include, but are not limited to: unsaturated liner fluorohydrocarbons shown by $C_3H_5F$ such as 3-fluoropropene, 1-fluoropropene, 2-fluoropropene; unsaturated liner fluorohydrocarbons shown by $C_3H_4F_2$ such as 1,1-difluoropropene, 3,3-difluoropropene; unsaturated cyclic fluorohydrocarbons shown by C3H3F such as 3-fluorocyclopropene, 1-fluorocyclopropene; unsaturated liner fluorohydrocarbons shown by $C_4H_7F$ such as 1-fluorobutene, 2-fluorobutene, 3-fluorobutene, 4-fluorobutene, 1-fluoro-2-butene, 2-fluoro-2-butene, 1-fluoro-2-methylpropene, 3-fluoro-2-methylpropene, 2-(fluoromethyl)-propene; unsaturated liner fluorohydrocarbons shown by $C_4H_6F_2$ such as 1,1-difluoro-2-methylpropene, 3,3-difluoro-2-methylpropene, 2-(fluoromethyl)-fluoropropene, 3,3-difluorobutene, 4,4-difluorobutene, 1,2-difluorobutene, 1,1-difluoro-2-butene, 1,4-difluoro-2-butene; unsaturated liner fluorohydrocarbons shown by $C_4H_5F_3$ such as 4,4,4-trifluorobutene, 3,3,4-trifluorobutene, 1,1,1-trifluoro-2-butene, 1,1,4-trifluoro-2-butene; unsaturated cyclic fluorohydrocarbons shown by $C_4H_5F$ such as 1-fluorocyclobutene, 3-fluorocyclobutene; unsaturated cyclic fluorohydrocarbons shown by $C_4H_4F_2$ such as 3,3-difluorocyclobutene, 3,4-difluorocyclobutene; unsaturated liner fluorohydrocarbons shown by $C_5H_9F$ such as 1-fluoropentene, 2-fluoropenten, 3-fluoropenten, 4-fluoropentene, 5-fluoropenten, 1-fluoro-2-pentene, 2-fluoro-2-pentene, 3-fluoro-2-pentene, 4-fluoro-2-pentene, 5-fluoro-2-pentene, 1-fluoro-2-methylbutene, 1-fluoro-3-methylbutene, 3-fluoro-2-methylbutene, 3-fluoro-3-methylbutene, 4-fluoro-2-methylbutene, 4-fluoro-3-methylbutene, 1-fluoro-2-methyl-2-butene, 1-fluoro-3-methyl-2-butene, 2-fluoro-3-methyl-2-butene, 2-(fluoromethyl)-butene; unsaturated liner fluorohydrocarbons shown by $C_5H_8F_2$ such as 3,3-difluoropentene, 4,4-difluoropentene, 5,5-difluoropentene, 1,2-difluoropentene, 3,4-difluoropentene, 3,5-difluoropentene, 4,5-difluoropentene; unsaturated cyclic fluorohydrocarbons shown by $C_5H_7F$ such as 1-fluorocyclopentene, 3-fluorocylopentene, 4-fluorocyclopentene; unsaturated cyclic fluorohydrocarbons shown by $C_5H_6F_2$ such as 3,3-difluorocyclopentene, 4,4-difluorocyclopentene, 1,3-difluorocyclopentene, 1,4-difluorocyclopentene, 3,5-difluorocyclopentene.

Additionally or alternatively, the fluorohydrocarbon gas can include one or more alkyne fluorohydrocarbon gas having the formula of $C_xH_yF_z$, wherein x is an integer selected from 3, 4, and 5, y and z are positive integers, and y is greater than z. The one or more alkyne fluorohydrocarbon gas can include, but are not limited to: unsaturated liner fluorohydrocarbon shown by $C_3H_3F$ such as 3-fluoropropyne; unsaturated liner fluorohydrocarbon shown by $C_3H_2F_2$ such as 3,3-difluoropropyne; unsaturated liner fluorohydrocarbons shown by $C_4H_5F$ such as 3-fluorobutyne, 4-fluorobutyne, 1-fluoro-2-butyne; unsaturated liner fluorohydrocarbons shown by $C_4H_4F_2$ such as 3,3-difluorobutyne, 4,4-difluorobutyne, 3,4-difluorobutyne, 1,4-difluoro-2-butyne; unsaturated liner fluorohydrocarbons shown by $C_5H_7F$ such as 3-fluoropentyne, 4-fluoropentyne, 5-fluoropentyne, 1-fluoro-2-pnetyne, 4-fluoro-2-pentyne, 5-fluoro-2-pentyne, 3-(fluoromethyl)-butyne; unsaturated liner fluorohydrocarbons shown by $C_5H_6F_2$ such as 3,3-difluoropentyne, 4,4-difluoropentyne, 5,5-difluoropentyne, 3,4-difluoropentyne, 4,5-difluoropentyne, 1,1-difluoro-2-pentyne, 4,4-difluor-2-pentyne, 5,5-difluoro-2-pentyne, 4,5-difluoro-2-pentyne, 3-(difluoromethyl)-butyne, 3-(fluoromethyl)-4-fluorobutyne.

Upon reaction with silicon in the silicon portion 110, silicon oxide in the silicon oxide portion 120, and silicon nitride in the silicon nitride portion 110, the fluorohydrocarbon-containing plasma generates a significant quantity of polymers on the top surfaces of the silicon portion 110 and the silicon oxide portion 120. The quantity of polymers on the top surfaces of the silicon portion 110 and the silicon oxide portion 120 is significant enough to be measurable employing analytical instruments available in the art such as Auger electron spectroscopy (AES) or x-ray photoelectron spectroscopy (XPS). The thicknesses of the polymers on the top surfaces of the silicon portion 110 and the silicon oxide portion 120 can be from 0.1 nm to 3 nm depending on the process conditions employed to generate the fluorohydrocarbon-containing plasma.

Specifically, a first fluorohydrocarbon-containing polymer 117 is formed on the top surface of the silicon portion 110, a second fluorohydrocarbon-containing polymer 127 is formed on the top surface of the silicon oxide portion 120, and a third fluorohydrocarbon-containing polymer 167 is formed on the top surfaces of the silicon nitride portion 160. The first fluorohydrocarbon-containing polymer 117, the second hydrocarbon-containing polymer 127, and the third fluorohydrocarbon-containing polymer 167 include carbon, hydrogen, and fluorine. The second hydrocarbon-containing polymer 127 further includes oxygen. Further, if $O_2$ or another oxygen-containing gas is supplied into the process chamber as one of the source gases, the first fluorohydrocarbon-containing polymer 117 and the second hydrocarbon-containing polymer 127 includes oxygen.

In one embodiment, the first fluorohydrocarbon-containing polymer 117 and the second fluorohydrocarbon-containing polymer 127 include carbon at an atomic concentration between 30% and 40%, hydrogen at an atomic concentration between 40% and 50%, fluorine at an atomic concentration between 5.0% and 10.0%, and oxygen at an atomic concentration less than 5%.

The third fluorohydrocarbon-containing polymer 167 includes carbon, hydrogen, fluorine, and optionally oxygen, and additionally includes nitrogen. Thus, the third fluorohydrocarbon-containing polymer 167 includes a nitrogen-containing compound formed by interaction of the fluorohydrocarbon-containing plasma with the silicon nitride portion 160. The nitrogen-containing compound is a volatile compound including C, H, F, and N. As used herein, a volatile compound refers to a compound that evaporates in vacuum at 297.3 K. Thus, the third fluorohydrocarbon-containing polymer 167 volatilizes, and is removed from the top surface of the silicon nitride portion 160, during the anisotropic etch.

The thickness of the first fluorohydrocarbon-containing polymer 117 on the silicon portion 110 during a steady state of the anisotropic etch is herein referred to as a first thickness t1. As used herein, a steady state of an etch refers to a state at which the thicknesses of the etch byproducts such as polymers do not change in time. The thickness of the second fluorohydrocarbon-containing polymer 127 on the silicon oxide portion 120 during the steady state of the anisotropic etch is herein referred to as a second thickness t2. At the time of deposition, the first, second, and third fluorohydrocarbon-containing polymers (117, 127, 167) have the same composition.

The bottom portion of the third fluorohydrocarbon-containing polymer 167 interacts with the silicon nitride material in the silicon nitride portion 160 and subsequently volatilizes. Thus, the thickness of the third fluorohydrocarbon-containing polymer 167 remains insignificant, and the third fluorohydrocarbon-containing polymer 167 does not impede the interaction of the fluorohydrocarbon-containing plasma with the silicon nitride material in the silicon nitride portion 160. In contrast, the first fluorohydrocarbon-containing polymer 117 does not interact with the underlying silicon material. Further, the second fluorohydrocarbon-containing polymer 127 does not interact with the underlying silicon oxide in the silicon oxide portion 120 in any significant manner. Thus, the first fluorohydrocarbon-containing polymer 117 and the second fluorohydrocarbon-containing polymer 127 impede the interaction of the fluorohydrocarbon-containing plasma with the silicon portion 110 and with the silicon oxide portion 120.

Because the first fluorohydrocarbon-containing polymer 117 and the second fluorohydrocarbon-containing polymer 127 do not interact with underlying silicon material or the underlying silicon oxide material, the first thickness t1 is not less than, i.e., either greater than or is equal to, the third thickness t3, and the second thickness t2 is not less than the third thickness t3. Further, the first thickness t1 is not less than the second thickness t2 because the fluorohydrocarbon-containing plasma deposits more fluorohydrocarbon-containing polymer on a silicon surface than on a silicon oxide surface.

Because the first thickness t1 is not less than the second thickness t2, and the second thickness is not less than the third thickness, the fluorohydrocarbon plasma etches the silicon nitride portion at an etch rate that is not less than corresponding etch rates for the silicon portion 110 and the silicon oxide portion 120. In addition, the fluorohydrocarbon plasma etches the silicon oxide portion 120 at a greater etch rate than the silicon portion 110.

The combination of the differences among the thicknesses of the various fluorohydrocarbon-containing polymers (110, 120, 160) and the reaction between the third fluorohydrocarbon-containing polymer 167 with the underlying silicon nitride material provides high selectivity to the anisotropic etch process so that the anisotropic etch removes silicon nitride with high selectivity to silicon oxide and silicon.

The recess depth by which the top surface of the silicon portion 110 is vertically recessed by the end of the anisotropic etch relative to the original top surface of the silicon portion 110 prior to the anisotropic etch is herein referred to as a first recess depth d1. The recess depth by which the top surface of the silicon oxide portion 120 is vertically recessed by the end of the anisotropic etch relative to the original top surface of the silicon oxide portion 120 prior to the anisotropic etch is herein referred to as a second recess depth d2. The recess depth by which the top surface of the silicon nitride portion 160 is vertically recessed by the end of the anisotropic etch relative to the original top surface of the silicon nitride portion 160 prior to the anisotropic etch is herein referred to as a third recess depth d3.

In one embodiment, the anisotropic etch can be employed to perform a silicon nitride etch process that is selective to silicon and/or silicon nitride with a high selectivity. As used herein, the selectivity of the silicon nitride etch process relative to silicon is the ratio of the third recess depth d3 to the first recess depth d1. As used herein, the selectivity of the silicon nitride etch process relative to silicon oxide is the ratio of the third recess depth d3 to the second recess depth. In one embodiment, the selectivity of the silicon nitride etch process employing the fluorohydrocarbon-containing plasma described above relative to silicon can be greater than 10 when lateral dimensions of the silicon portion 110 and the lateral dimensions of the silicon nitride portion 160 are greater than 10 nm. In one embodiment, the selectivity of the silicon nitride etch process employing the fluorohydrocarbon-containing plasma described above relative to silicon oxide can be greater than 5 when lateral dimensions of the silicon portion 110 and the lateral dimensions of the silicon oxide portion 120 are greater than 10 nm.

In conventional silicon nitride etch processes, the number of carbon atoms in the plasma precursor gas is less than 3. Further, the number of fluorine atoms in the ions of the conventional plasma is greater than the number of hydrogen atoms in the molecules of a conventional plasma. The selectivity of the conventional silicon nitride etch processes relative to silicon oxide is provided by the combination of the ability of the plasma to remove silicon nitride and the inability of the plasma to remove silicon oxide under normal plasma conditions, i.e., when the ions of the plasma has an energy greater than 200 eV and the oxide etchant supply is removed by excess oxygen. The selectivity of the conventional silicon nitride etch process relative to silicon is provided indirectly by including hydrogen ions in the conventional plasma, which reduces the silicon etchant supply and converts the surface portion of the exposed silicon into silicon oxide and prevents further etching of silicon.

In contrast, the number of carbon ions in the molecule of the fluorohydrocarbon-containing plasma of the present disclosure is at least 3. Further, the number of hydrogen atoms in the molecule of the fluorohydrocarbon-containing plasma is greater than the number of fluorine atoms in the molecule of the fluorohydrocarbon-containing plasma in the present disclosure. Thus, the atomic percentages of carbon and hydrogen in the first, second, and third fluorohydrocarbon-containing polymers (117, 127, 167) increase over the corresponding atomic percentages in any polymer of conventional silicon nitride etch processes. At the same time, the atomic percentage of fluorine in the first, second, and third fluorohydrocarbon-containing polymers (117, 127, 167) is less than the corresponding atomic percentage in any polymer of conventional silicon nitride etch processes. The increased carbon content and decreased fluorine content renders the first, second, and third fluorohydrocarbon-containing polymers (117, 127, 167) as deposited non-etchable by the fluorohydrocarbon-containing plasma given appropriate plasma conditions. However, the third fluorohydrocarbon-containing polymer 167 is reduced by formation of a nitrogen-containing volatile compound that is formed by interaction between the third fluorohydrocarbon-containing polymer and the underlying silicon nitride material. Thus, the mechanism for providing selectivity in the silicon nitride etch relative to silicon and silicon oxide is deposition of fluorohydrocarbon-containing polymer on oxide and silicon surfaces that is not etchable by the fluorohydrocarbon-containing plasma.

In addition to the change in the quality of the fluorohydrocarbon-containing polymer of the present disclosure relative to any polymer deposits generated in conventional silicon nitride etch processes, the amount of first, second, and third fluorohydrocarbon-containing polymers (117, 127, 167) per unit recess depth for a silicon nitride portion increases significantly over the amount of any polymer generated in conventional silicon nitride etch processes. The amount of any polymer, if present, in the conventional silicon nitride etch processes is typically not measurable by analytical instruments. In contrast, the amount of the first fluorohydrocarbon-containing polymer 117 and the second fluorohydrocarbon-containing polymer 127 is typically measurable by analytical instruments such as an Auger electron spectrometer.

Because fluorohydrocarbon-containing polymers are generated in significant quantities in the anisotropic etch process of the present disclosure, the energy of the fluorohydrocarbon-containing plasma can be significantly lowered relative to the energy employed for conventional silicon nitride etch processes. As used herein, the quantity of the fluorohydrocarbon-containing polymers is "significant" if the fluorohydrocarbon-containing polymers are measurable by analytical equipments known in the art. Thus, the high selectivity of the silicon nitride etch process relative to silicon and silicon nitride can be employed to reduce the energy of the ions in the fluorohydrocarbon-containing plasma so that less plasma damage occurs on various physically exposed surfaces of the first exemplary structure. Reducing the energy of the ions in the fluorohydrocarbon-containing plasma decreases the total amount of polymers, i.e., the first, second, and third fluorohydrocarbon-containing polymers (117, 127, 167), that are formed during the anisotropic etch process employing the fluorohydrocarbon-containing plasma.

Ions in the fluorohydrocarbon-containing plasma can have any energy employed in conventional plasma etching of silicon nitride, which requires minimum ion energy of 200 eV in order to etch silicon nitride in any significant manner. In contrast, the ions in the fluorohydrocarbon-containing plasma can have an energy less than 200 eV. Specifically, the ions in the fluorohydrocarbon-containing plasma of the present disclosure can have an average kinetic energy between 10 eV and 1 keV. In one embodiment, the ions in the fluorohydrocarbon-containing plasma of the present disclosure can have an average kinetic energy in a range from 10 eV to 100 eV.

The fluorohydrocarbon-containing plasma of the present disclosure can be employed for various anisotropic silicon nitride etch processes that require high selectivity relative to silicon and/or silicon nitride in semiconductor manufacturing. Such applications include, but are not limited to, an anisotropic etch for formation of a silicon nitride gate spacer and a silicon nitride liner etch, which is a break-through etch at the end of a contact via cavity formation process.

In one embodiment, the first fluorohydrocarbon-containing polymer 117 and the second fluorohydrocarbon-containing polymer 127 are not etchable with any fluorohydrocarbon-containing plasma in the absence of oxygen an at a plasma energy less than 1 keV.

The first exemplary structure illustrates the relative etch rates a silicon portion 110, a silicon oxide portion 120, and a silicon nitride portion 160 employing a configuration in which the silicon portion 110, the silicon oxide portion 120, and the silicon nitride portion 160 have the same height h. It is understood that the same height h for the silicon portion 110, the silicon oxide portion 120, and the silicon nitride portion 160 is for illustrative purposes only, and the heights of a silicon portion 110, a silicon oxide portion 120, and a silicon nitride portion 160 can in general differ. Further, the coplanarity of the top surfaces and the bottom surfaces of the silicon portion 110, the silicon oxide portion 120, and the silicon nitride portion 160 prior to the etch is merely coincidental, and in general, the relative heights and lateral extends of each of a silicon portion 110, a silicon oxide portion 120, and a silicon nitride portion 160 can vary in general semiconductor structures. All such variations are contemplated herein. The relationship among the various etch rates and the relationship among the various fluorohydrocarbon-containing polymers are the same in such altered configurations.

Figure 3:
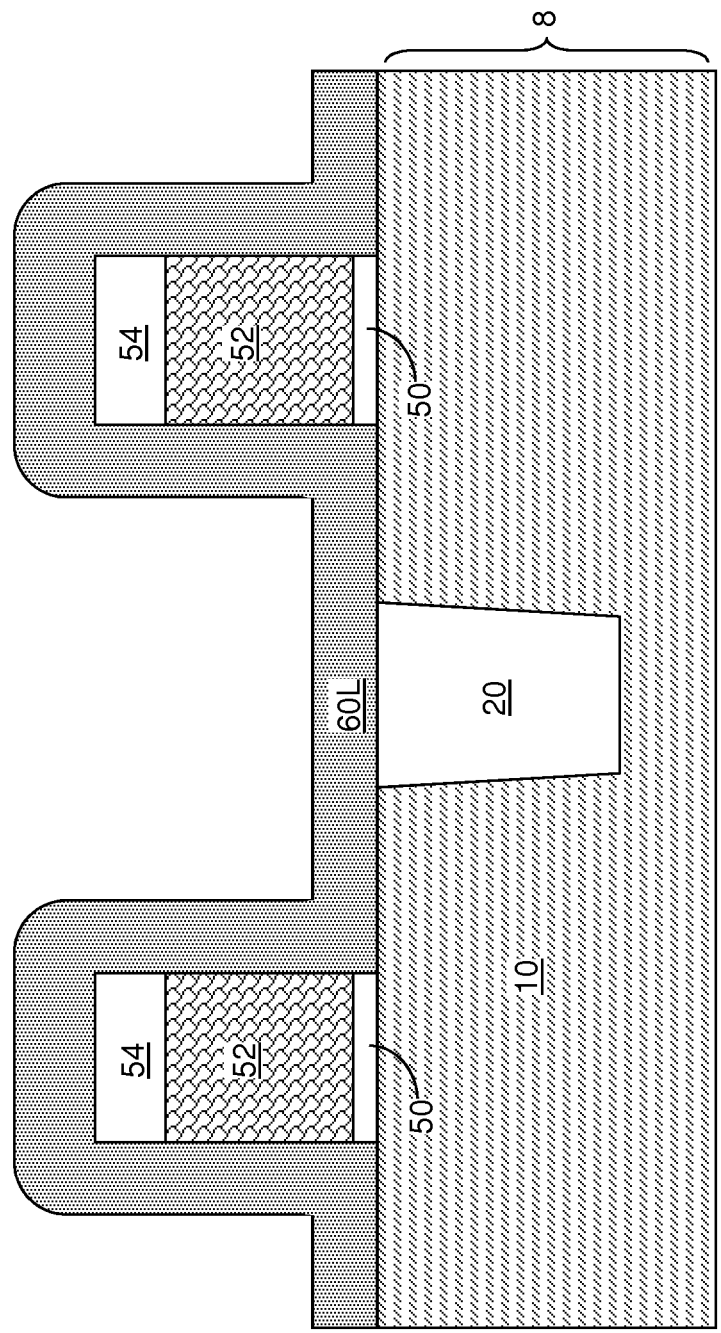
FIG. 3 is a schematic vertical cross-sectional view of a second exemplary structure after formation of gate stacks and a silicon nitride layer according to a second embodiment of the present disclosure.

Referring to FIG. 3, a second exemplary structure according to a second embodiment of the present disclosure includes a semiconductor substrate 8, gate stacks formed thereupon, and a silicon nitride layer 60L formed over the semiconductor substrate 8 and the gate stacks. The semiconductor substrate 8 includes a semiconductor layer 10 that includes a semiconductor material portion 10. The semiconductor material portion 10 includes a silicon-based material that can be any of the material that may be employed for the silicon portion 110 described above.

A shallow trench isolation structure 20 including silicon oxide is formed within the semiconductor material portion 10 in the semiconductor substrate 8. The shallow trench isolation structure 20 can be formed, for example, by forming shallow trenches in the semiconductor material portion 10 and filling the shallow trenches with silicon oxide, which can be deposited, for example, by chemical vapor deposition (CVD). Excess portions of silicon oxide can be removed from above the top surface of the semiconductor material portion 10, for example, by chemical mechanical planarization (CMP).

Gate stacks can be formed, for example, by forming a stack of a gate dielectric layer, a gate conductor layer, and an optional gate cap dielectric layer, and lithographically patterning the stack. Each gate stack can include, from bottom to top, a gate dielectric 50, a gate electrode 52, and an optional gate cap dielectric 54. The gate cap dielectric 54 can include silicon oxide or silicon nitride. The sidewalls of the gate dielectric 50, the gate electrode 52, and the gate cap dielectric 54 can be vertically coincident, i.e., coincide among one another in a top down view, i.e., a view from above in a direction perpendicular to the horizontal plane between the semiconductor material portion 10 and the gate dielectrics 50.

While an embodiment illustrating formation of the gate stacks (50, 53, 54) by a gate first integration scheme is illustrated herein, it is noted that the structure including at least one stack of a gate dielectric 50, a gate electrode 52, and an optional gate cap dielectric 54 can be formed in employing any method known in the art including, but not limited to, the gate first integration scheme and a replacement gate scheme that employs a planarization dielectric layer to define gate cavities for forming gate stacks and subsequently removes the planarization dielectric layer.

The silicon nitride layer 60L can be deposited, for example, by low pressure chemical vapor deposition (LPCVD), plasma enhanced chemical vapor deposition (PECVD), high density plasma chemical vapor deposition (HDPCVD), subatmospheric chemical vapor deposition (SACVD), or any other silicon nitride deposition methods known in the art. The silicon nitride layer 60L can be conformal or non-conformal. The silicon nitride layer 60L can include a stoichiometric silicon nitride or a non-stoichiometric silicon nitride. The thickness of the silicon nitride layer 60L can be from 3 nm to 300 nm, although lesser and greater thicknesses can also be employed. Optionally, another gate spacer (not shown) including silicon oxide, silicon oxynitride, and/or a dielectric metal oxide can be formed directly on the sidewalls of the gate stacks (50, 52, 54) prior to deposition of the silicon nitride layer 60L.

Figure 4:
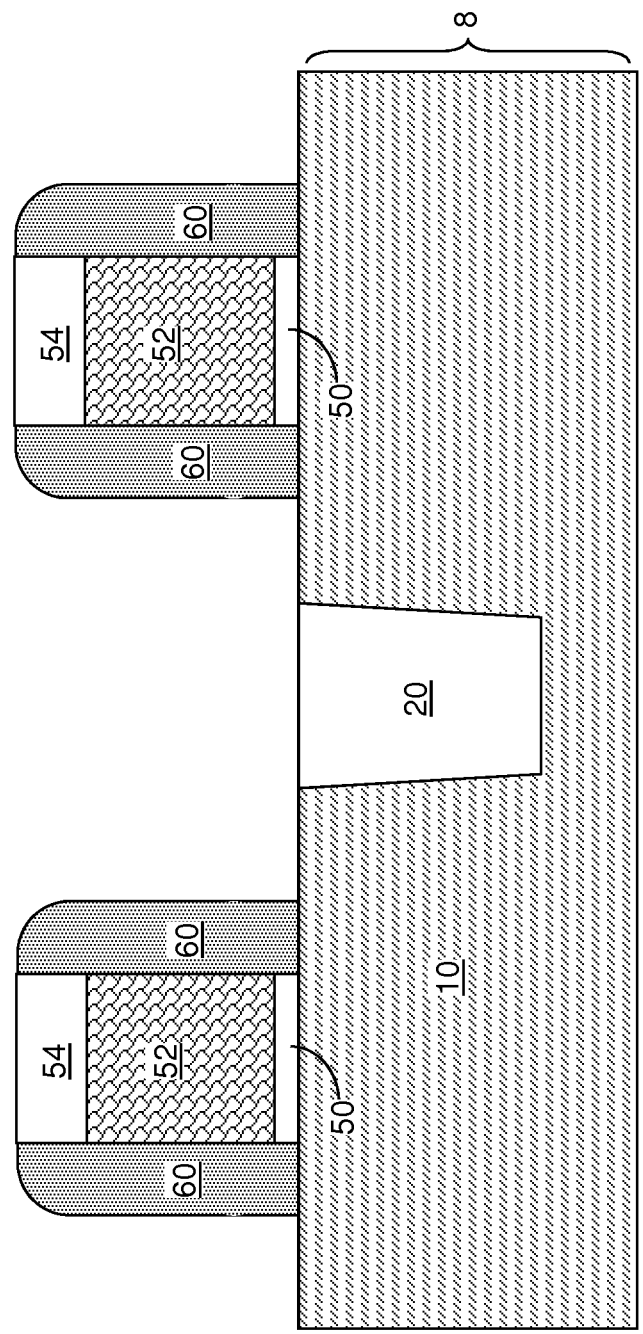
FIG. 4 is a schematic vertical cross-sectional view of the second exemplary structure at the beginning of an overetch step according to the second embodiment of the present disclosure.
Figure 5:
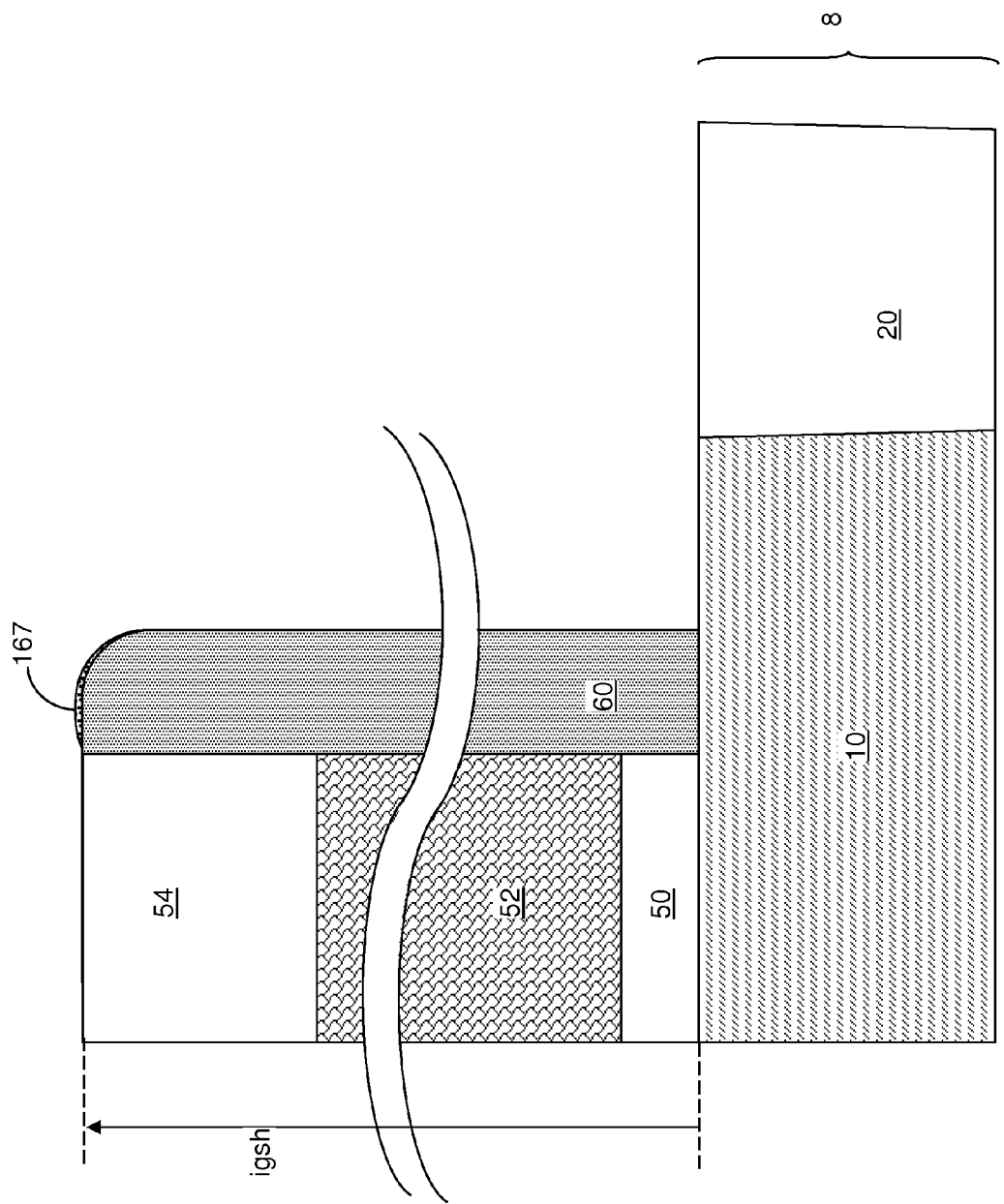
FIG. 5 is a magnified view of FIG. 4 according to the second embodiment of the present disclosure.

Referring to FIGS. 4 and 5, the second exemplary structure is placed in a process chamber configured for performing an anisotropic etch therein. An anisotropic etch employing the fluorohydrocarbon-containing plasma described above is performed on the second exemplary structure so that the silicon nitride layer 60L is anisotropically etched. As discussed above, the fluorohydrocarbon-containing plasma is generated by decomposition of $C_xH_yF_z$, wherein x is an integer selected from 3, 4, 5, and 6, y and z are positive integers, and y is greater than z.

During the anisotropic etch, horizontal portions of the silicon nitride layer 60L are completely removed and a top surface of the semiconductor material portion 10 and a top surface of the shallow trench isolation structure 20 become physically exposed to the fluorohydrocarbon-containing plasma. FIGS. 4 and 5 illustrate the second exemplary structure at the moment of the first physical exposure of the semiconductor material portion 10 and the top surface of the shallow trench isolation structure 20. The vertical distance between the top surface of the gate cap dielectrics 54 and the bottom surface of the gate dielectrics 50 is herein referred to as an initial gate stack height igsh of the gate stack (50, 52, 54).

A fluorohydrocarbon-containing polymer is present on horizontal surfaces of the silicon nitride layer 60L throughout the duration of the anisotropic etch, including the moment at which the second exemplary structure has a configuration illustrated in FIGS. 4 and 5. The fluorohydrocarbon-containing polymer is herein referred to as a third fluorohydrocarbon-containing polymer 167, and has the same characteristics as the third fluorohydrocarbon-containing polymer 167 in the first exemplary structure. Upon removal of the horizontal portions of the silicon nitride layer 60L, the third fluorohydrocarbon-containing polymer 167 is also removed from the area from which the horizontal portions of the silicon nitride layer 60L are removed. Upon removal of the horizontal portions of the silicon nitride layer 60L, remaining portions of the silicon nitride layer 60L constitute silicon nitride spacers 60 that laterally surround the gate stacks (50, 52, 54).

In one embodiment, the top surfaces of the silicon nitride spacers 60 can be coplanar with the top surfaces of the gate cap dielectrics 54. Further, the top surface of the shallow trench isolation structure 20 and the top surface of the semiconductor material portion 10 can be coplanar with the bottommost surfaces of the gate dielectrics 50, i.e., with the plane including the interface between the semiconductor material portion 10 and the gate dielectrics 50, at this processing step.

The anisotropic etch includes an overetch, which is the portion of the anisotropic etch that is performed after the top surfaces of the semiconductor material portion 10 and the shallow trench isolation structure 20 are physically exposed.

The etch chemistry and the composition and energy of the fluorohydrocarbon-containing plasma can remain the same throughout the duration of the anisotropic etch including the overetch step.

Figure 6:
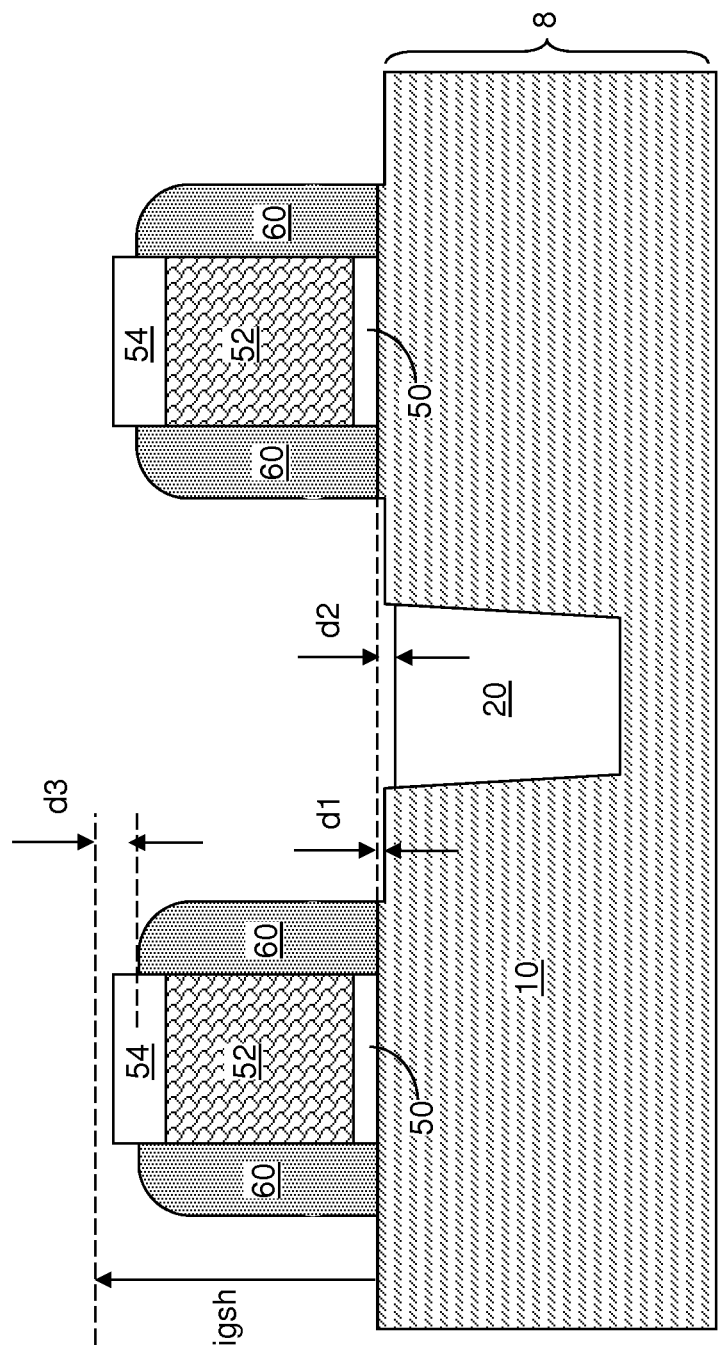
FIG. 6 is a schematic vertical cross-sectional view of the second exemplary structure during the overetch step according to the second embodiment of the present disclosure.
Figure 7:
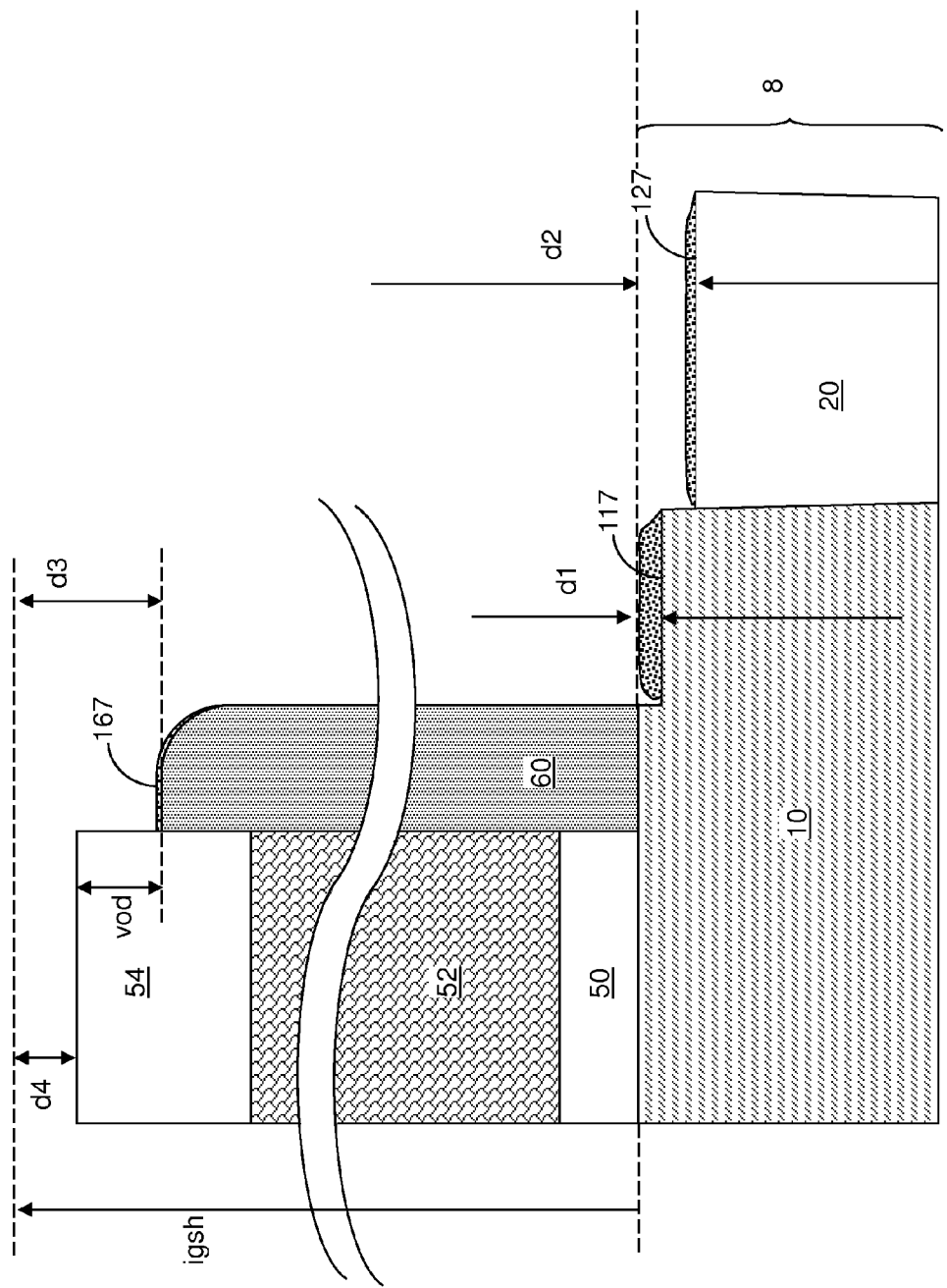
FIG. 7 is a magnified view of FIG. 6 according to the second embodiment of the present disclosure.

Referring to FIGS. 6 and 7, the top surface of the shallow trench isolation structure 20 and the top surface of the semiconductor material portion 10 are vertically recessed during the overetch, which is a terminal portion of the anisotropic etch. Further, the top surfaces of the silicon nitride spacer 60 are vertically recessed. The vertical distance by which the top surface of the semiconductor material portion 10 is recessed is herein referred to as a first recess distance d1. The vertical distance by which the top surface of the shallow trench isolation structure 20 is recessed is herein referred to as a second recess distance d2. The vertical distance by which the top surfaces of the silicon nitride spacers 60 are recessed is herein referred to as a third recess distance d3. The first distance d1 is not greater than the second distance d2, and the second distance d2 is not greater than the third distance d3 for the same reasons as discussed in the first embodiment.

A first fluorohydrocarbon-containing polymer 117 is formed on the top surface of the semiconductor material portion 10 in the same manner as on the top surface of the silicon portion 110 (See FIG. 2) in the first embodiment. A second fluorohydrocarbon-containing polymer 127 is formed on the top surface of the shallow trench isolation structure in the same manner as on the top surface of the silicon oxide portion 120 (See FIG. 2) in the first embodiment. A third fluorohydrocarbon-containing polymer 167 is formed on the top surfaces of the silicon nitride spacers 60 in the same manner as on the top surface of the silicon nitride portion 160 (See FIG. 2) in the first embodiment. The first thickness is not less than, i.e., greater than or equal to, the second thickness, and the second thickness is not less than the third thickness for the same reasons as discussed in the first embodiment.

The second exemplary structure illustrated in FIGS. 6 and 7 is a semiconductor structure that includes the semiconductor material portion 10 located in the semiconductor substrate 20, and the shallow trench isolation structure 20 which includes silicon oxide, is embedded within the semiconductor substrate 8, and is in contact with the semiconductor material portion 10. Further, the semiconductor structure includes gate stacks (50, 52, 54) located on the semiconductor material portion 10. Each gate stack (50, 52, 54) can include a gate dielectric 50, a gate electrode 52, and a gate cap dielectric 54. The semiconductor structure also includes silicon nitride spacers 60 laterally surrounding each gate stack (50, 52, 54). The top surface of the semiconductor material portion 10 is vertically recessed from a horizontal plane including an interface between the gate dielectrics 50 and the semiconductor material portion 10 by a first recess distance d1. The top surface of the shallow trench isolation structure 20 is vertically recessed from the horizontal plane by a second recess distance d2. The top surfaces of the silicon nitride spacers 60 are vertically recessed from the original top surfaces of the gate cap dielectrics 54, which is vertically offset from the interface between the semiconductor material portion 10 and the gate dielectrics 50 by the initial gate stack height igsh, by a third recess distance d3. The top surfaces of the gate cap dielectrics 54 are vertically recessed from the original top surfaces of the gate cap dielectrics 54 by a fourth recess distance d4. The distance between the bottom surfaces of the gate dielectrics 50 and the top surfaces of the gate cap dielectrics 54 as recessed by the fourth recess distance is herein referred to as a modified gate stack height, which is h−d4. The difference between the third recess distance d3 and the fourth recess distance d4 is herein referred to as a vertical offset distance vod. A fluorohydrocarbon polymer (not shown) can be present over the gate cap dielectrics 54 during, and after, etching of the gate cap dielectrics 54.

The first recess distance d1 is not greater than the second recess distance d2, and is not greater than the third recess distance d3. In one embodiment, the first recess distance d1 is less than the second recess distance d3, and is less than the third recess distance d3. If the gate cap dielectrics 54 include silicon oxide, d4 can be the same as d2, and vod can be a positive quantity, i.e., the top surface of the gate cap dielectrics 54 are located above the top surface of the silicon nitride spacers 60. If the gate cap dielectrics 54 include silicon nitride, d4 can be the same as d3, and vod can be zero, i.e., the top surface of the gate cap dielectrics 54 can be coplanar with the top surface of the silicon nitride spacers 60, which are dielectric gate spacers.

Figure 8:
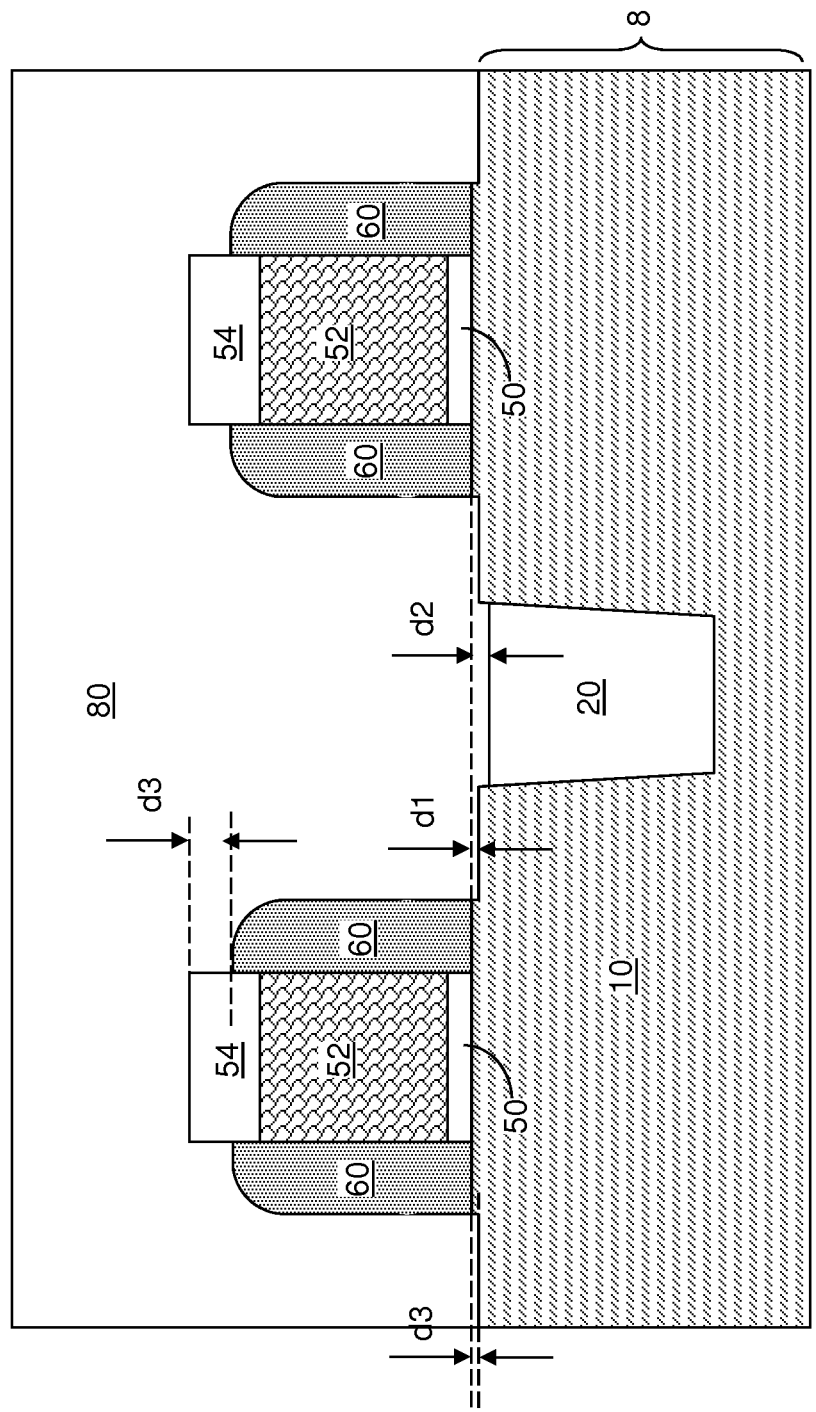
FIG. 8 is a schematic vertical cross-sectional view of the second exemplary structure after formation of at least one contact-level dielectric layer according to the second embodiment of the present disclosure.

Referring to FIG. 8, the various fluorohydrocarbon-containing polymers (117, 127, 167) are cleaned, for example, by a wet clean process. At least one contact-level dielectric layer 80 can be subsequently deposited over the semiconductor substrate 8, the gate stacks (50, 52, 54), and the silicon nitride spacers 60.

Figure 9:
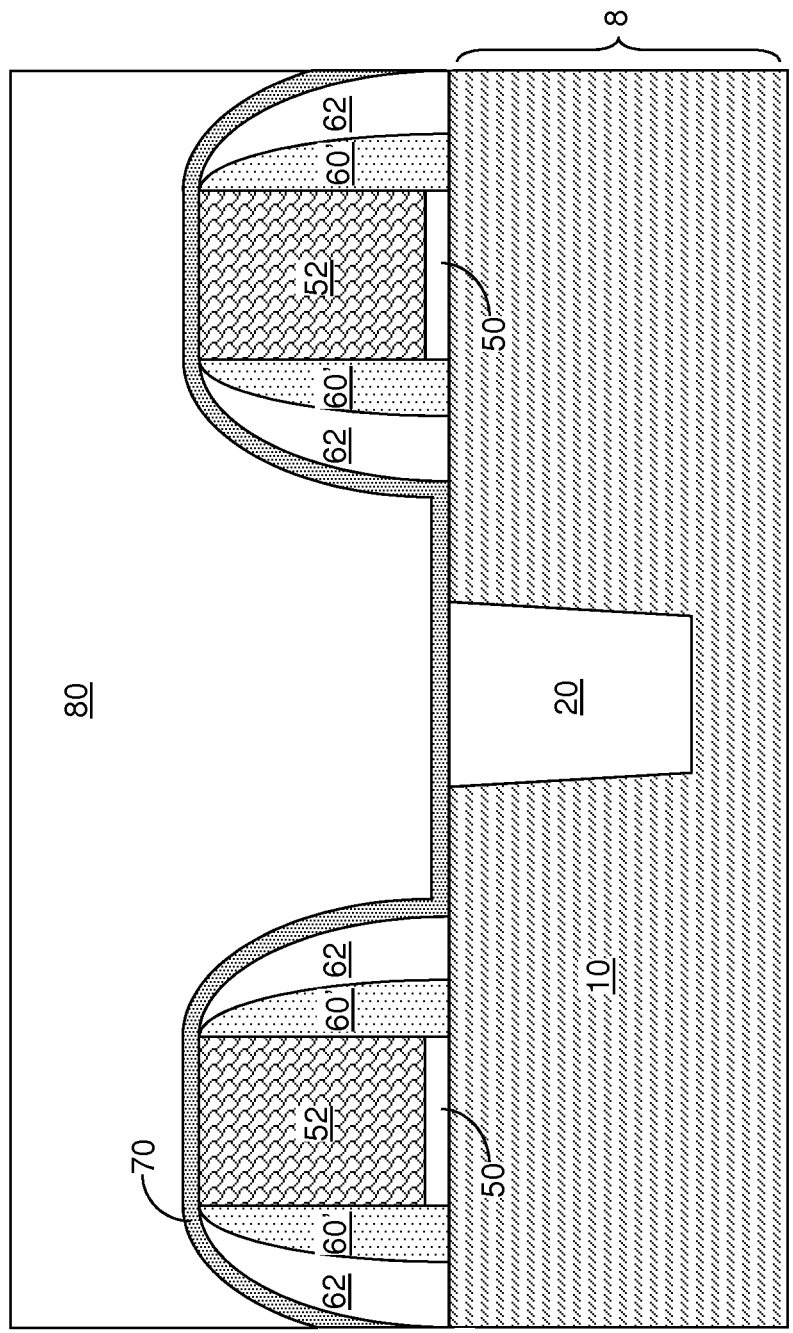
FIG. 9 is a schematic vertical cross-sectional view of a third exemplary structure after formation of a silicon nitride liner and at least one contact-level dielectric layer according to a third embodiment of the present disclosure.

Referring to FIG. 9, a third exemplary structure according to a third embodiment of the present disclosure includes a semiconductor substrate 8, which can be the same as the semiconductor substrate 8 of the second exemplary structure. Further, the third exemplary structure includes gate stacks (50, 52), which can be the same as the gate stacks in the second exemplary structure, and can optionally include gate cap dielectrics 54 illustrated in FIGS. 3-8. A gate spacer is formed on sidewalls of each gate stack (50, 52) employing methods known in the art and/or the methods of the second embodiment of the present disclosure.

In one embodiment, the outer surfaces of the gate spacer can include a silicon oxide surface. For example, each gate spacer can include an optional inner gate spacer 60' and an outer gate spacer 62 that includes a doped or undoped silicon oxide. The optional inner spacer 60', if present, can include a dielectric material such as silicon nitride, silicon oxynitride, a dielectric metal oxide, a doped or undoped silicon oxide having a composition that is the same as, or different from, the composition of the outer gate spacer 62.

A silicon nitride liner 70 is formed on the physically exposed top surfaces of the semiconductor substrate 8, the outer surfaces of the outer gate spacer 62, and the top surfaces of the gate stacks (50, 52), for example, by chemical vapor deposition (CVD). The silicon nitride liner 70 can include a stoichiometric silicon nitride or a non-stoichiometric silicon nitride. The thickness of the silicon nitride liner 70 can be from 3 nm to 50 nm, although lesser and greater thicknesses can also be employed.

At least one contact-level dielectric layer 80 is deposited over the silicon nitride liner 70, for example, by chemical vapor deposition. The at least one contact-level dielectric layer 80 can include a doped or undoped silicon oxide, organosilicate glass, and/or a dielectric metal oxide. Alternatively, the at least one contact-level dielectric layer 80 can include a vertical stack, from bottom to top, of a dielectric material other than silicon nitride and a silicon nitride layer. The dielectric material other than silicon nitride can be any of a doped or undoped silicon oxide, organosilicate glass, and a dielectric metal oxide. The top surface of the at least one contact-level dielectric layer 80 can be planarized, for example, by chemical mechanical planarization.

Figure 10:
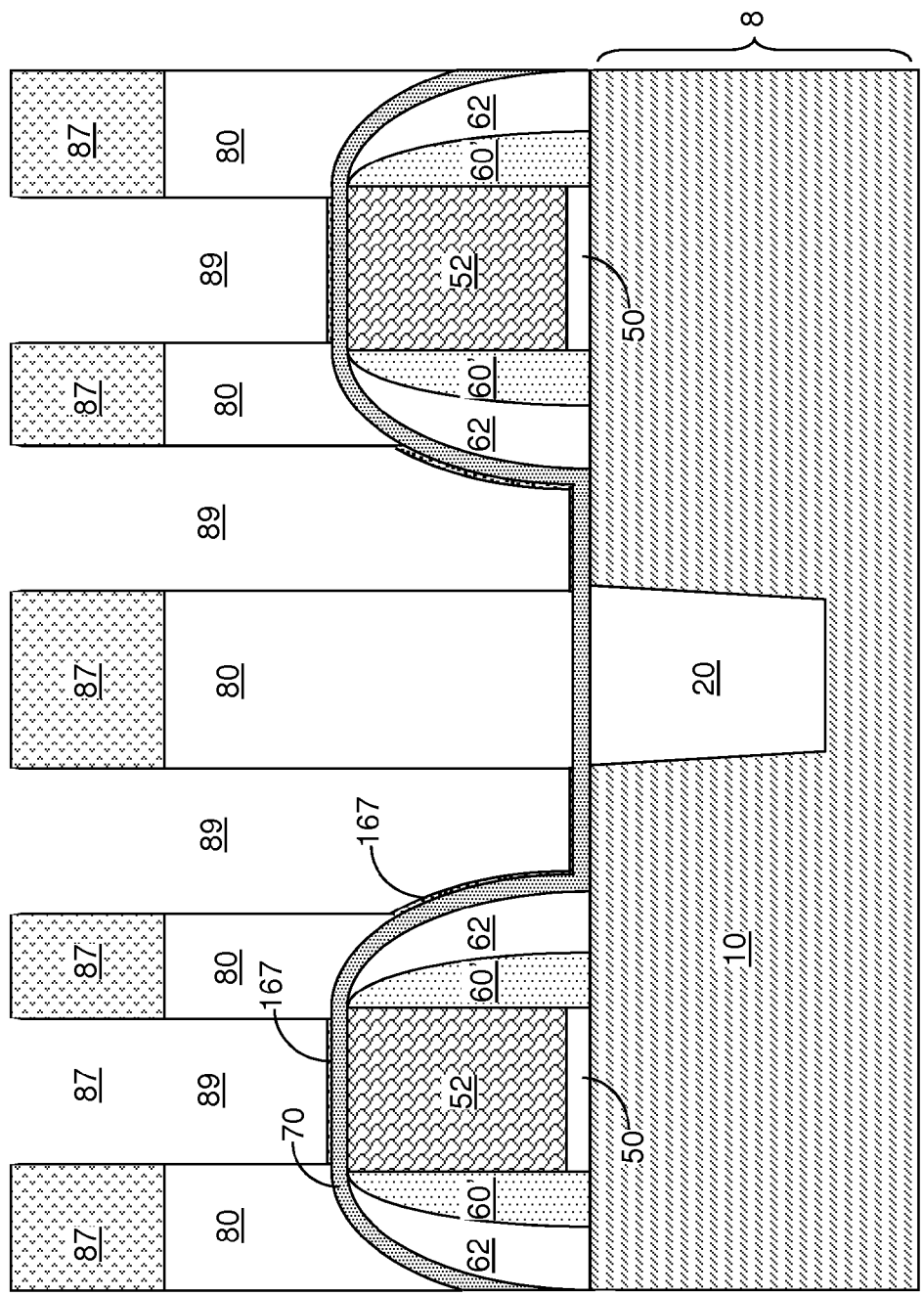
FIG. 10 is a schematic vertical cross-sectional view of the third exemplary structure after forming contact via holes within the at least one contact-level dielectric layer according to the third embodiment of the present disclosure.

Referring to FIG. 10, a patterned masking structure is formed over the silicon nitride layer 70. For example, a photoresist 87 can be applied over the at least one contact-level dielectric layer 80, and can be patterned by lithographic exposure and development. A pattern including various opening is formed within the photoresist 87.

The pattern in the photoresist 87 is transferred into the at least one contact-level dielectric layer 80 by an anisotropic etch, which can employ any suitable etch chemistry known in the art for the purpose of etching the dielectric material(s) of the at least one contact-level dielectric layer 80. The silicon nitride layer 70 can be employed as a stopping layer for the anisotropic etch that is employed to remove the dielectric materials of the at least one contact-level dielectric layer 80 underneath the openings in the photoresist 87. Various contact via holes 89 are formed, which extend from the top surface of the photoresist 87 to the top surface of the silicon nitride layer are formed.

Upon physical exposure of the top surface of the silicon nitride liner 70 at the bottom of the various contact via holes 89, another anisotropic etch employing the fluorohydrocarbon-containing plasma described above can be employed. This anisotropic etch is a herein referred to as a break-through etch, because the purpose of this anisotropic etch is to break through the silicon nitride liner 70, and to extend the various contact via holes 89 to the semiconductor material portion 10 and to a conductive portion, i.e., the gate electrode 52, within each gate stack (50, 52, 54). The combination of the photoresist 87 and the at least one contact-level dielectric layer 80 can be employed as a patterned masking structure, i.e., an etch mask, for the purpose of the break-through etch.

The plasma employed during the break-through etch can be the same as described in the first and second embodiments. A third fluorohydrocarbon-containing polymer 167, which has the same composition and property as the third fluorohydrocarbon-containing polymer 167 in the first and second embodiment, is formed on the physically exposed surface of the silicon nitride liner 70 during the anisotropic etch, i.e., the break-through etch. The third fluorohydrocarbon-containing polymer 167 includes a same material as the first and second fluorohydrocarbon-containing polymers (117, 127) of the first and second embodiments, and further includes a volatile nitrogen-containing compound formed by interaction of the fluorohydrocarbon-containing plasma with the silicon nitride liner 70.

The silicon nitride liner 70 is etched through at the bottom of the various contact via holes 89. The anisotropic etch continues during an overetch step, which is built into the anisotropic etch to ensure that all silicon nitride material is removed from underneath the various contact via holes 89 irrespective of statistical variations (e.g., run to run, wafer to wafer, and/or within wafer) in the thickness of the silicon nitride liner 70 and/or statistical variations (e.g., run to run, wafer to wafer, and/or within wafer) in the actual etch rate of the break-through etch on silicon nitride.

Figure 11:
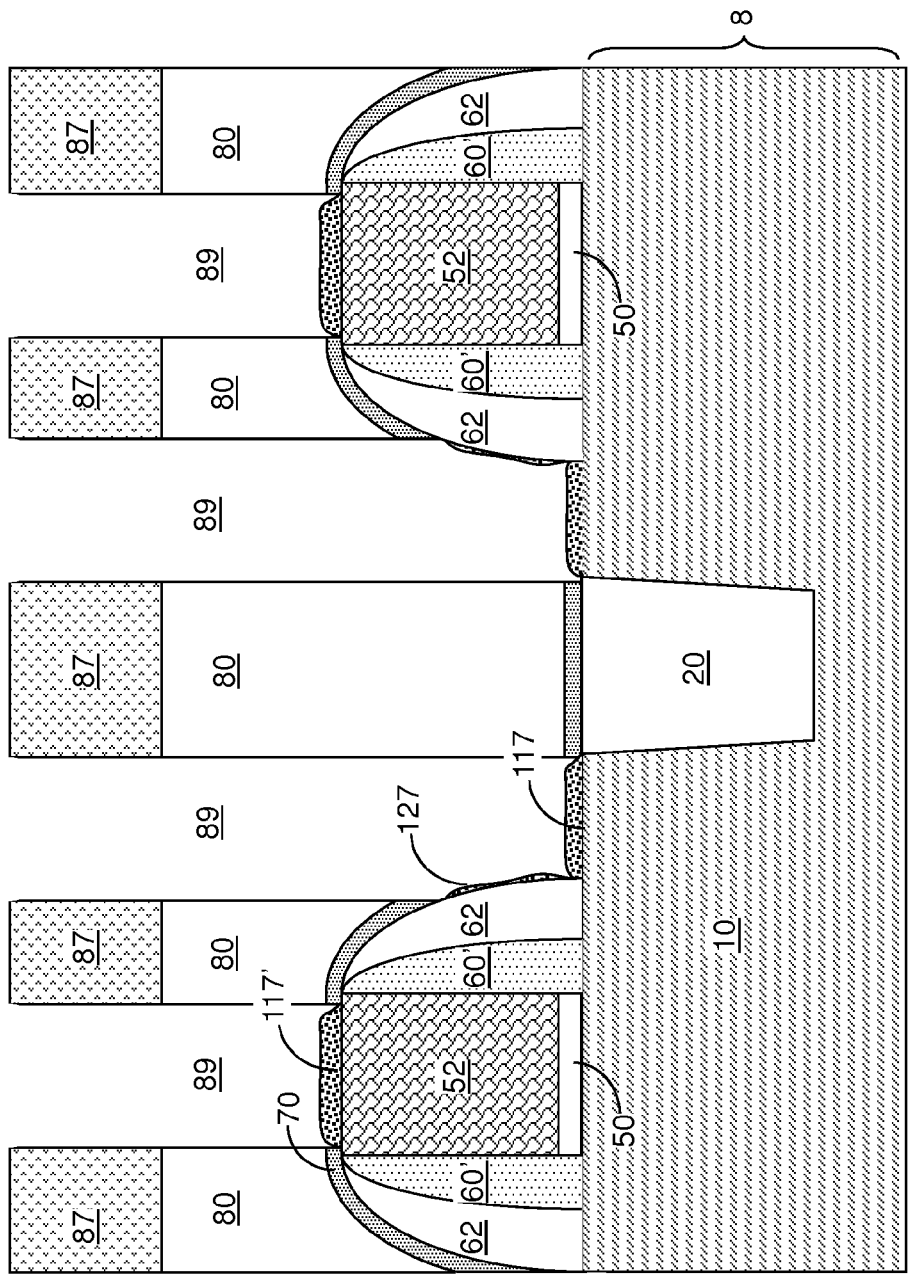
FIG. 11 is a schematic vertical cross-sectional view of the third exemplary structure after a break-through etch through the silicon nitride liner according to the third embodiment of the present disclosure.

Referring to FIG. 11, during the overetch step of the break-through etch, physically exposed portions of the semiconductor material portion 10 and the outer gate spacer 62 are recessed. A first fluorohydrocarbon-containing polymer 117 having a first thickness is formed directly on the semiconductor material portion 10 at a bottom of an opening in the silicon nitride liner 70, i.e., at a bottom of one of the various contact via holes 89. A second fluorohydrocarbon-containing polymer 127 having a second thickness (as measured along a direction that is locally perpendicular to a recessed outer surface of the outer gate spacer 62) is formed directly on silicon oxide surfaces of the outer gate spacers 62. The first fluorohydrocarbon-containing polymer 117 and the second fluorohydrocarbon-containing polymer 127 are formed by the same mechanism as discussed in the first embodiment, and correspondingly, the first fluorohydrocarbon-containing polymer 117 and the second fluorohydrocarbon-containing polymer 127 can have the same composition as in the first embodiment. The first thickness is not less than the second thickness for the reasons discussed in the first embodiment. The first fluorohydrocarbon-containing polymer 117 and the second fluorohydrocarbon-containing polymer 127 can have a same composition as discussed in the first embodiment.

The third exemplary structure is a semiconductor structure that includes a gate stack (50, 52) located over the semiconductor material portion 10 in the semiconductor substrate 8, at least one gate spacer, which can include an optional inner gate spacer 60' and an outer gate spacer 62, laterally surrounding the gate stack (50, 52) and having a silicon oxide surface on an outer sidewall thereof, and a silicon nitride liner 70 located over the gate spacer (60', 62) and the semiconductor material portion 10 and including an opening therein. The silicon oxide surface of the outer gate spacer 62' and a top surface of the semiconductor material portion 10 underlie the opening. The first fluorohydrocarbon-containing polymer 117 has a first thickness, and is located directly on the surface of the semiconductor material portion 10 and at a bottom of the opening, i.e., one of the various contact via holes 89. The second fluorohydrocarbon-containing polymer 127 has a second thickness, and is located directly on the silicon oxide surface. The first thickness is not less than the second thickness.

Figure 12:
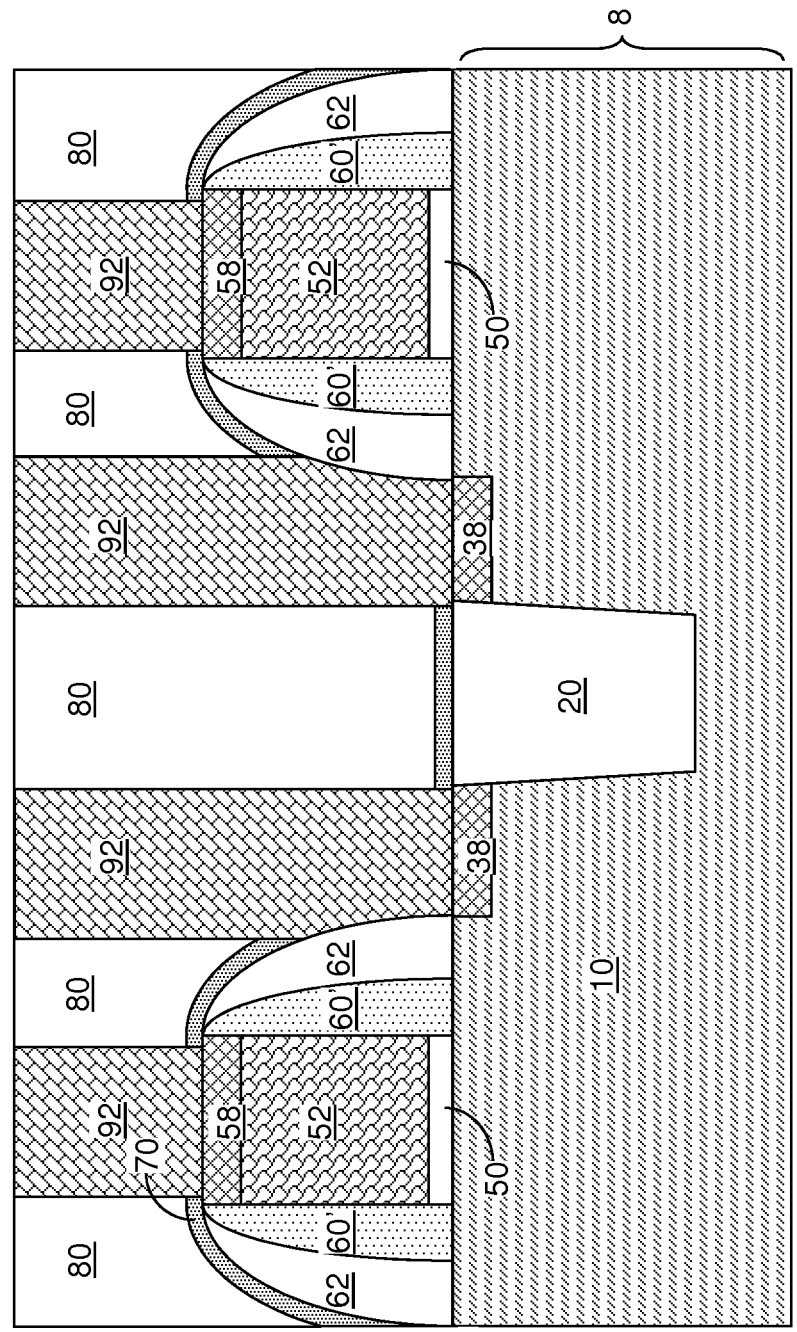
FIG. 12 is a schematic vertical cross-sectional view of the third exemplary structure after formation of contact via structures within the contact via holes according to the third embodiment of the present disclosure.

Referring to FIG. 12, the various fluorohydrocarbon-containing polymers are removed, for example, by a wet clean. A conductive material is deposited within the various contact via holes 89. After removal of the excess conductive material from above the top surface of the at least one contact-level dielectric layer 80, various contact via structures 92 are formed within the various contact via holes 89 to provide electrical contact to various semiconductor components in the semiconductor substrate 8 and/or in the gate electrodes 58. Optionally, various metal semiconductor alloy regions (38, 58) can be formed on semiconductor surfaces at the bottom of the various contact via holes 89 prior to formation of the various contact via structures 92.

While the disclosure has been described in terms of specific embodiments, it is evident in view of the foregoing description that numerous alternatives, modifications and variations will be apparent to those skilled in the art. For example, the methods and structures of the embodiments of the present disclosure can be applied to structures including, but not limited to, finFET structures, trigate structures, and nanowire structure as known in the art. Accordingly, the disclosure is intended to encompass all such alternatives, modifications and variations which fall within the scope and spirit of the disclosure and the following claims.

What is claimed is:

1. A method of forming a semiconductor structure comprising:
    forming a shallow trench isolation structure comprising silicon oxide within a semiconductor material portion in a semiconductor substrate;
    forming a gate stack on said semiconductor material portion;
    forming a silicon nitride layer on said gate stack, said semiconductor material portion, and said shallow trench isolation structure; and
    anisotropically etching said silicon nitride layer to form a silicon nitride spacer laterally surrounding said gate stack, wherein a top surface of said shallow trench isolation structure and a top surface of said semiconductor material portion are physically exposed and subsequently recessed during said anisotropic etching, and a first recess distance by which a top surface of said semiconductor material portion is recessed after physical exposure of said top surface of said semiconductor material portion is less than a second recess distance by which a top surface of said shallow trench isolation structure is recessed after said physical exposure of said top surface of said semiconductor material portion, and is less than a third recess distance by which a top surface of said silicon nitride spacer is recessed after said physical exposure of said top surface of said semiconductor material portion.

2. The method of claim 1, wherein said top surface of said shallow trench isolation structure and said top surface of said semiconductor material portion are coplanar with a bottommost surface of said gate dielectric prior to said anisotropic etch.

3. The method of claim 1, wherein second recess distance is less than said third recess distance.

4. The method of claim 1, where said silicon nitride layer is etched employing a fluorohydrocarbon-containing plasma, wherein a first thickness of a first fluorohydrocarbon-containing polymer formed on said top surface of said semiconductor material portion is greater than a second thickness of a second fluorohydrocarbon-containing polymer formed on said top surface of said shallow trench isolation structure, and is greater than a third thickness of a third fluorohydrocarbon-containing polymer on said top surface of said silicon nitride spacer.

5. The method of claim 4, wherein said fluorohydrocarbon-containing plasma is generated by decomposition of $C_xH_yF_z$, wherein x is an integer selected from 3, 4, 5, and 6, y and z are positive integers, and y is greater than z.

* * * * *